(12) United States Patent
Nakajima et al.

(10) Patent No.: US 7,986,927 B2
(45) Date of Patent: Jul. 26, 2011

(54) SEMICONDUCTOR INTEGRATED CIRCUIT DEVICE AND HIGH-FREQUENCY POWER AMPLIFIER MODULE

(75) Inventors: Akishige Nakajima, Tokyo (JP);
Yasushi Shigeno, Tokyo (JP); Tomoyuki Ishikawa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 867 days.

(21) Appl. No.: 11/960,242

(22) Filed: Dec. 19, 2007

(65) Prior Publication Data
US 2008/0197923 A1      Aug. 21, 2008

(30) Foreign Application Priority Data
Feb. 20, 2007   (JP) .................................. 2007-039317

(51) Int. Cl.
*H01Q 11/12*   (2006.01)
*H04B 1/04*    (2006.01)

(52) U.S. Cl. ................ 455/127.4; 455/63.1; 455/67.13; 455/83; 455/333; 455/552.1; 375/297

(58) Field of Classification Search ................. 455/63.1, 455/78, 83, 114.2, 127.1, 127.2, 127.4, 333, 455/552.1, 553.1, 571, 67.13; 375/295, 296, 375/297, 346; 330/250
See application file for complete search history.

(56) References Cited

U.S. PATENT DOCUMENTS

| 5,134,317 | A  | * | 7/1992  | Ohta ............................... 326/98 |
| 7,466,189 | B2 | * | 12/2008 | Sohara et al. .................. 327/536 |
| 7,650,134 | B2 | * | 1/2010  | Nakajima et al. ............. 455/341 |
| 2004/0229577 | A1 |   | 11/2004 | Struble |

FOREIGN PATENT DOCUMENTS
JP   2006-178928   7/2006

OTHER PUBLICATIONS
U.S. Appl. No. 11/765,236, filed Jun. 2007, Nakajima, et al.
* cited by examiner

*Primary Examiner* — Quochien B Vuong
(74) *Attorney, Agent, or Firm* — Mattingly & Malur, PC

(57) ABSTRACT

Upon application of an on-state voltage to a control terminal, an antenna switch provided between an antenna terminal and a transmission terminal is turned on, and a transmission signal of a PCS/DCS system passes from the transmission terminal through the antenna terminal. At this time, a booster circuit, to which a part of the transmission signal is supplied, generates at an output terminal a boost voltage higher than a control voltage output from a controller due to the rectification of diodes, and applies the same to the gate of a transistor circuit of the antenna switch. Since in the booster circuit a resistor is coupled to the output terminal, the passage through resistors of an input transmission power in an RF signal path is only the passage through one resistor, thus reducing the attenuation of the transmission signal and providing an excellent insertion loss characteristic.

4 Claims, 5 Drawing Sheets

SEMICONDUCTOR INTEGRATED CIRCUIT DEVICE AND HIGH-FREQUENCY POWER AMPLIFIER MODULE

CROSS-REFERENCE TO RELATED APPLICATION

The disclosure of Japanese Patent Application No. 2007-39317 filed on Feb. 20, 2007 including the specification, drawings and abstract is incorporated herein by reference in its entirety.

BACKGROUND OF THE INVENTION

The present invention relates to techniques for achieving a higher performance of an antenna switch mounted in mobile communication devices and the like, and in particular relates to a technique effective in reducing distortion of an antenna switch used in multi band.

In addition to the voice communication and the wireless internet in the second generation mobile telephone, the advent of the third generation mobile telephone enabled a TV telephone, and a sound (music) and video distribution by the wireless internet, and thus a portable telephone system continues to grow for achieving higher functions, and the achieving of the multi-band and multi-mode is an essential requirement for portable terminals.

As the mobile telephones move to the multi-band and multi-mode, an antenna switch is having higher performance such as from SPDT (Single Pole Dual Thru) to SP4T, SP6T, and the like.

In mobile telephones, the key technical problem in the antenna switch is in that the introduction of digital modulation system such as EDGE (Enhanced Data rate for GSM Evolution) mode requires high linearity and thus a low distortion technique becomes important.

As the distortion reduction of the antenna switch in this type of mobile telephone, there is a technique in which FETs (Field Effect Transistor) constituting a SPDT switch are configured in multi-stage connection (e.g., a multi-gate configuration or a single three-stage configuration) (see Japanese Patent Application No. 2006-178928). In this case, as shown in FIG. 7B of Japanese Patent Application No. 2006-178928, the multi-stage connection allows an applied RF (Radio Frequency) voltage per stage to be dispersed, thus eliminating a pseudo-on state. Moreover, the multi stage connection allows the RF voltage applied to the FET to be dispersed, thus reducing the RF voltage per stage. Since the RF voltage applied to the gate-source capacitance (Cgs), the gate-drain capacitance (Cgd), and the on-resistance, which are the causes for generating harmonic distortion, is reduced, the harmonic distortion can be reduced.

However, the multi-stage connection by itself has a limit in further reducing the harmonic distortion, and thus a new circuit design technique is required.

As the technique for further reducing the harmonic distortion, there is a technique in which a booster circuit is provided in an antenna switch and a boost voltage generated by this booster circuit is applied to the gate electrode of the FET of a switch block, thereby increasing the gate-source voltage Vgs of a turned-off FET (see U.S. Patent laid-open No. 2004-0229577).

In the booster circuit shown in FIG. 10 of U.S. Patent laid-open No. 2004-0229577, a part of the transmission power is input to the booster circuit, and a voltage is generated in a capacitance 402 by rectification of two diodes 411, 412, and then a voltage higher than a control voltage Vc1, which is a control voltage of the FET, is output from the output terminal of the booster circuit.

SUMMARY OF THE INVENTION

However, the present inventor found that the technique for reducing the harmonic distortion in the antenna switch as described above has the following problem.

That is, the booster circuit of U.S. Patent laid-open No. 2004-0229577 (FIG. 10) described above has a problem in that a loss due to passing through the two resistors occurs and a decrease in the insertion loss, being an important item in the switch characteristic, occurs between a transmission signal terminal and an antenna output terminal.

It is an object of the present invention to provide a technique that can reduce the harmonic distortion of an antenna switch by preventing a decrease in the insertion loss while securing a sufficient boost voltage.

The above and other objects and novel features of the present invention will be apparent from the description and accompanying drawings of this specification.

A summary of a representative invention among the inventions disclosed in the present application will be described briefly as follows.

A semiconductor integrated circuit device according to the present invention comprises: a first terminal coupled to an antenna; a plurality of second terminals coupled to a transmitting circuit; switching transistor circuits placed between the first terminal and the second terminals respectively and switching a connection between the first terminal and the second terminal; and a booster circuit generating and outputting a boost voltage higher than a control signal of the switching transistor circuit, wherein the booster circuit includes: a control terminal to which the control signal of the switching transistor circuit is input; a boost terminal that outputs a boost voltage; a boost part which takes in a transmission signal output via the switching transistor circuit when the control signal is input to the control terminal, and which generates a boost voltage higher than a voltage level of the input control signal and applies the same to the control terminal of the switching transistor circuit via the boost terminal; and a loss improving resistor coupled between the second terminal and the boost terminal and reducing a voltage attenuation of the transmission signal.

Moreover, in the semiconductor integrated circuit device according to the present invention, the boost part includes: a first capacitive element whose one connection portion is coupled to the second terminal; a first resistor whose one connection portion is coupled to the other connection portion of the first capacitive element; a first diode whose cathode is coupled to the other connection portion of the first resistor; a second capacitive element whose one connection portion is coupled to an anode of the first diode; a second resistor whose one connection portion is coupled to the other connection portion of the first capacitive element; a second diode whose anode is coupled to the other connection portion of the second resistor and whose cathode is coupled to the other connection portion of the second capacitive element; and a third resistor whose one connection portion is coupled to the control terminal and the anode of the first diode and whose the other connection portion is coupled to the boost terminal; and wherein the loss improving resistor is coupled between the other connection portion of the first capacitive element and the boost terminal.

Moreover, in the semiconductor integrated circuit device according to the present invention, a transmission signal of a frequency band used in at least one of the communication systems of GSM (Global System for Mobile Communications), PCS (Personal Communications Service), and DCS (Digital Cellular System) is input to the second terminal coupled to the transmitting circuit.

Moreover, an overview of the other invention of the present application is provided briefly.

A high-frequency power amplifier module according to the present invention comprises: an antenna connection switching circuit; a high-frequency power amplifier receiving a transmission signal from a transmitting circuit and supplying an amplified transmission signal to the antenna connection switching circuit; and a controller outputting a control signal to the antenna connection switching circuit to control the antenna connection switching circuit, wherein the antenna connection switching circuit includes: a first terminal coupled to an antenna; a plurality of second terminals coupled to the transmitting circuit; switching transistor circuits placed between the first terminal and the second terminals respectively and switching a connection between the first terminal and the second terminal; and a booster circuit generating and outputting a boost voltage higher than the control signal of the switching transistor circuit; and wherein the booster circuit includes: a control terminal to which the control signal of the switching transistor circuit is input; a boost terminal outputting a boost voltage; a boost part which takes in a transmission signal output via the switching transistor circuit when the control signal is input to the control terminal, and which generates a boost voltage higher than a voltage level of the input control signal and applies the same to the control terminal of the switching transistor circuit via the boost terminal; and a loss improving circuit coupled between the second terminal and the boost terminal and reducing a voltage attenuation of the transmission signal.

Moreover, in the high-frequency power amplifier module of the present invention, the boost part includes: a first capacitive element whose one connection portion is coupled to the second terminal; a first resistor whose one connection portion is coupled to the other connection portion of the first capacitive element; a first diode whose cathode is coupled to the other connection portion of the first resistor; a second capacitive element whose one connection portion is coupled to an anode of the first diode; a second resistor whose one connection portion is coupled to the other connection portion of the first capacitive element; a second diode whose anode is coupled to the other connection portion of the second resistor and whose cathode is coupled to the other connection portion of the second capacitive element; and a third resistor whose one connection portion is coupled to the control terminal and the anode of the first diode and whose the other connection portion is coupled to the boost terminal; and wherein the loss improving resistor is coupled between the other connection portion of the first capacitive element and the boost terminal.

Moreover, in the high-frequency power amplifier module of the present invention, a transmission signal of a frequency band used in at least one of the communication systems of GSM, PCS, and DCS is input to the second terminal coupled to the transmitting circuit.

The effects obtained by the representative invention among the inventions disclosed in the present application will be described briefly as follows.

(1) The insertion loss in the booster circuit can be improved significantly.

(2) The harmonic distortion of the antenna switch can be reduced due to (1).

DETAILED DESCRIPTION OF THE PREFERRED EMBODIMENTS

Figure 1:
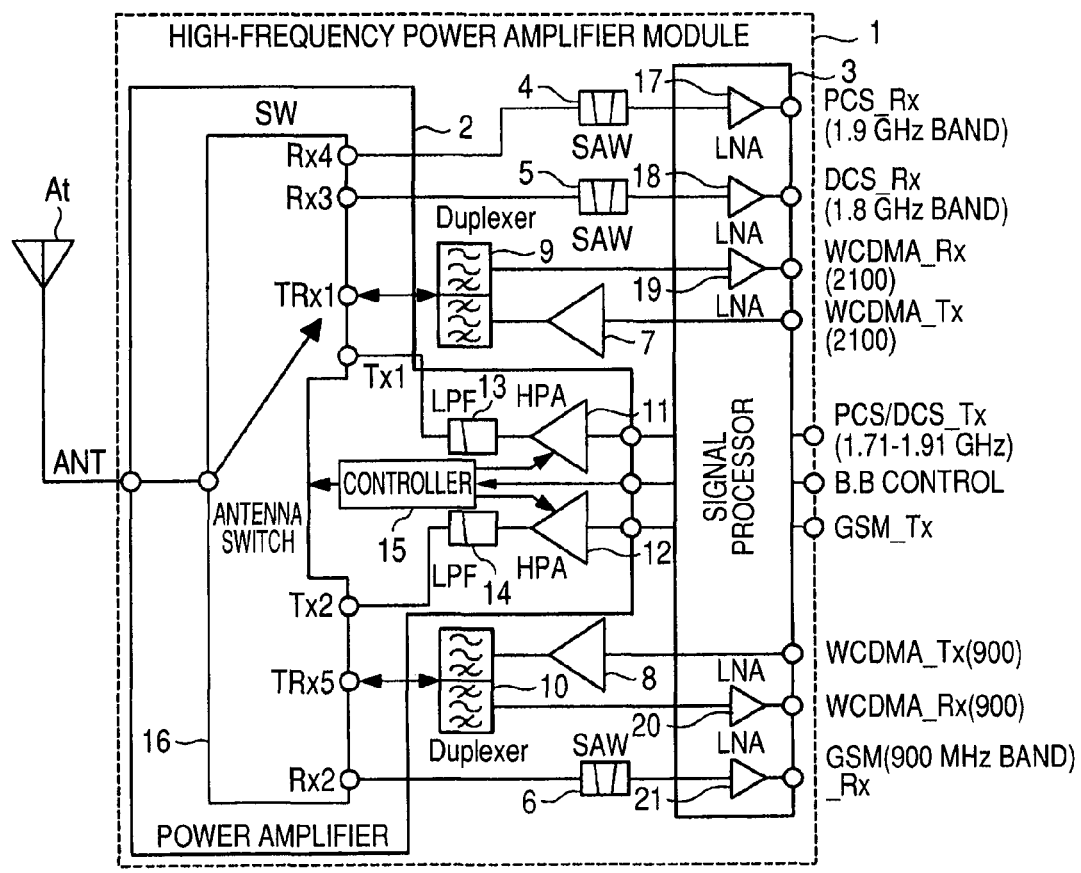
FIG. 1 is a block diagram showing a configuration of a high-frequency power amplifier module according to an embodiment of the present invention.

Hereinafter, an embodiment of the present invention will be described in detail in accordance with the accompanying drawings. In addition, through whole drawings for illustrating the embodiment, the same reference numerals and symbols are given to the same elements in principle and the repeated descriptions thereof are omitted.

Figure 2:
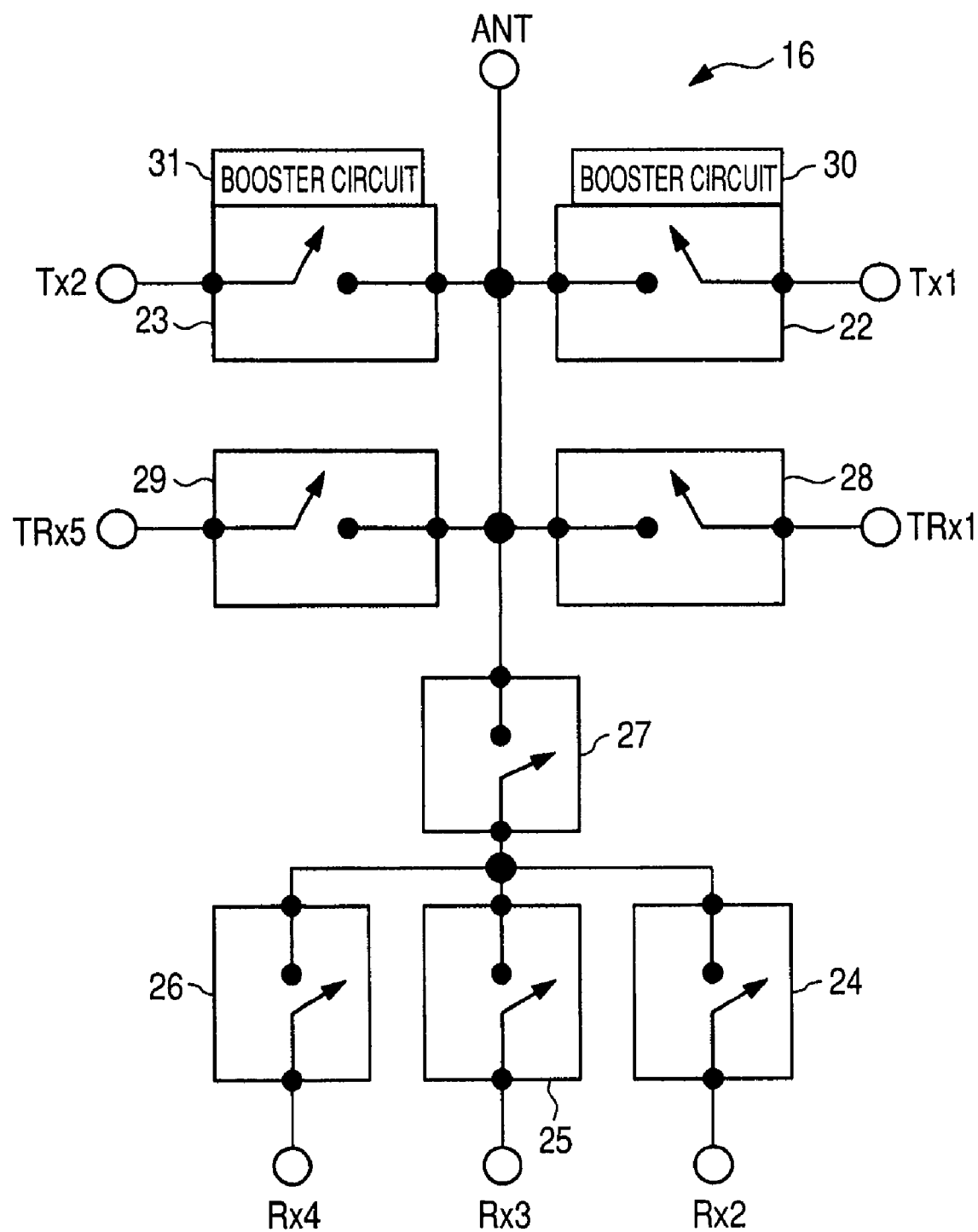
FIG. 2 is a block diagram showing a configuration of an antenna switch provided in the high-frequency power amplifier module of FIG. 1.
Figure 3:
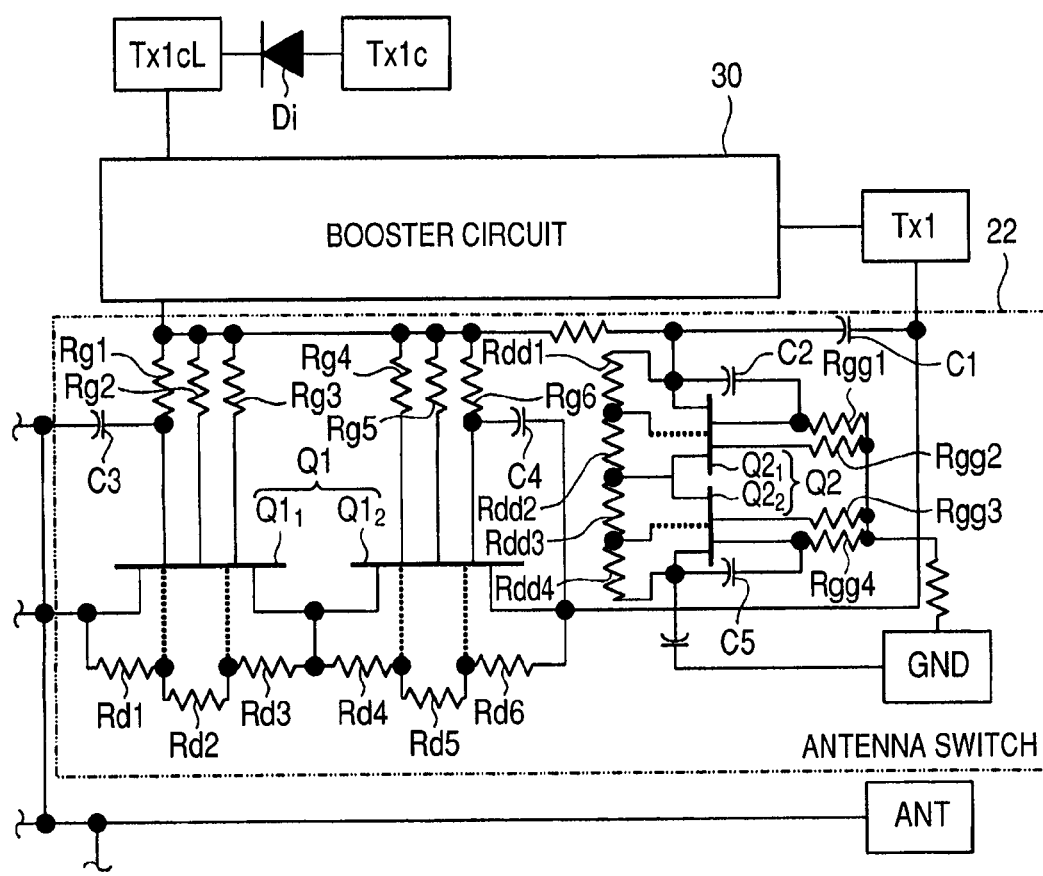
FIG. 3 is an explanatory view showing a configuration of an antenna switch and a booster circuit provided in the antenna switch of FIG. 2.
Figure 4:
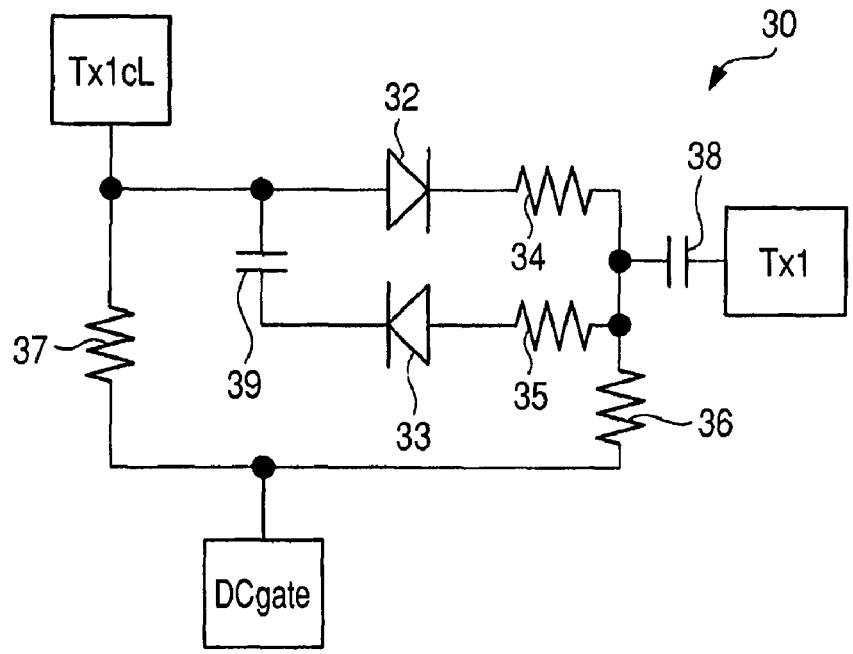
FIG. 4 is a circuit diagram showing a configuration of the booster circuit shown in FIG. 3.
Figure 5:
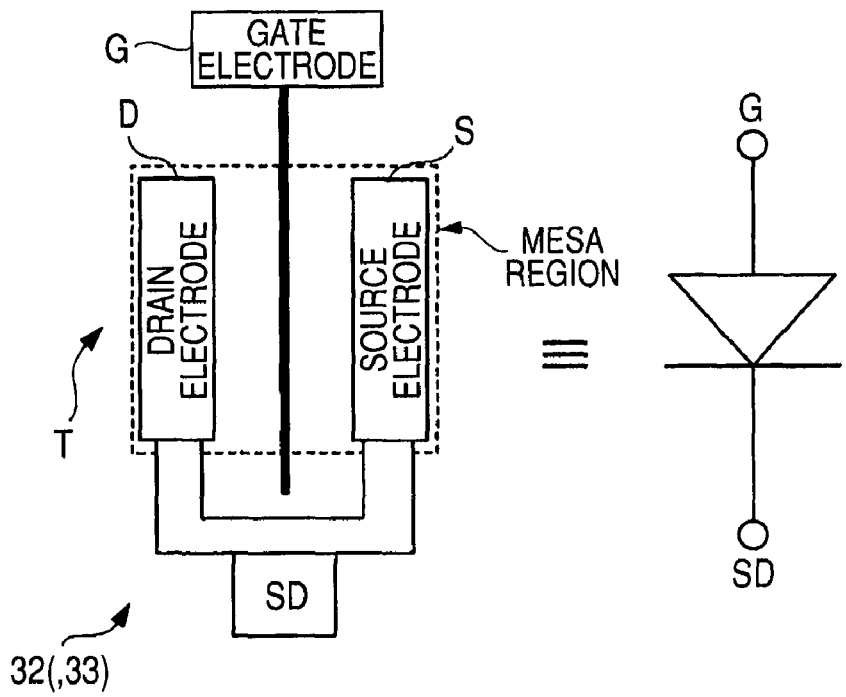
FIG. 5 is a layout pattern showing an example of a diode used in the booster circuit of FIG. 4.
Figure 6:
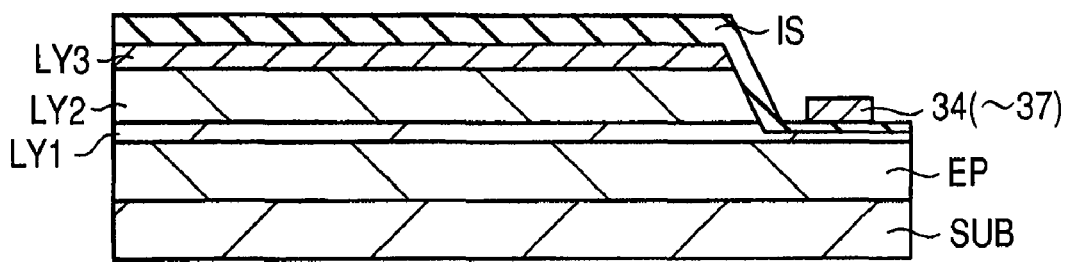
FIG. 6 is a cross sectional view showing an example of the manufacturing process of a resistor used in the booster circuit of FIG. 4.
Figure 7:
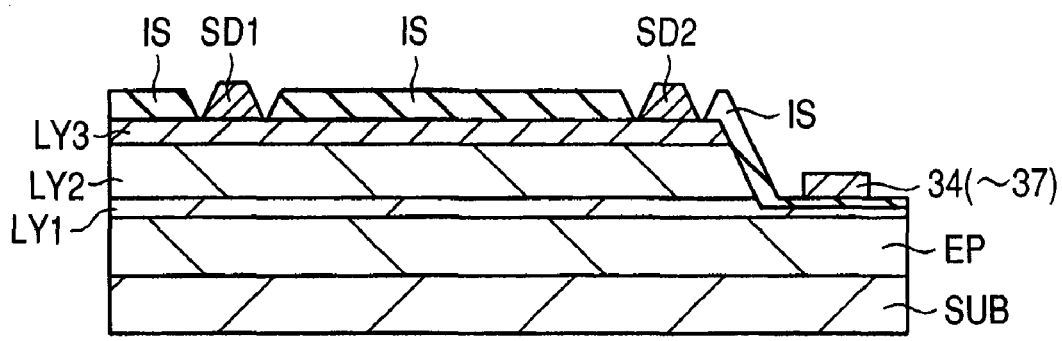
FIG. 7 is a cross sectional view showing an example of the manufacturing process of the diode used in the booster circuit of FIG. 4.
Figure 8:
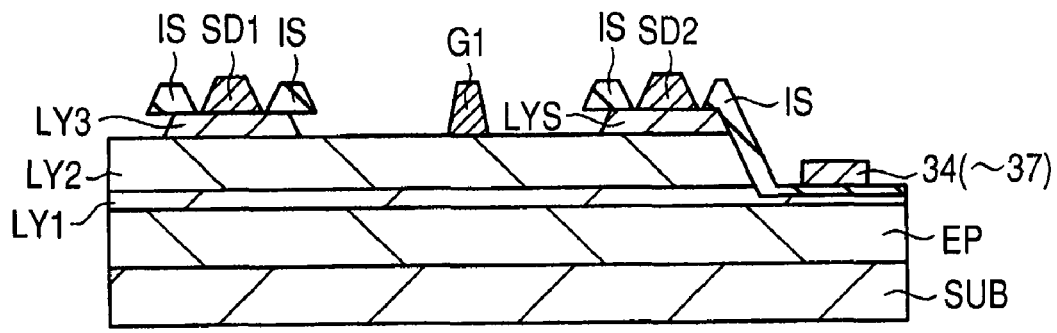
FIG. 8 is a cross sectional view showing an example of the manufacturing process following the manufacturing process of FIG. 7.

FIG. 1 is a block diagram showing a configuration of a high-frequency power amplifier module according to an embodiment of the present invention, FIG. 2 is a block diagram showing a configuration of an antenna switch provided in the high-frequency power amplifier module of FIG. 1, FIG. 3 is an explanatory view showing a configuration of an antenna switch and a booster circuit provided in the antenna switch of FIG. 2, FIG. 4 is a circuit diagram showing a configuration of the booster circuit shown in FIG. 3, FIG. 5 is a layout pattern showing an example of a diode used in the booster circuit of FIG. 4, FIG. 6 is a cross sectional view showing an example of the manufacturing process of a resistor used in the booster circuit of FIG. 4, FIG. 7 is a cross sectional view showing an example of the manufacturing process of the diode used in the booster circuit of FIG. 4, and FIG. 8 is a cross sectional view showing an example of the manufacturing process following the manufacturing process of FIG. 7.

In this embodiment, a high-frequency power amplifier module 1 is, for example, a transmission power amplifier module of a mobile telephone that is a communication system. The high-frequency power amplifier module 1 includes, as shown in FIG. 1, a power amplifier 2, a signal processor 3, SAW (Surface Acoustic Wave) filters 4 to 6, power amplifiers 7, 8 for W-CDMA (Wide Code Division Multiple Access), and duplexers 9, 10.

The power amplifier 2 includes: power amplifiers 11, 12 that function as a high-frequency power amplifier; low pass filters 13, 14; a controller 15; and an antenna switch 16. The signal processor 3 includes low noise amplifiers 17 to 21.

The antenna switch 16 that functions as an antenna connection switching circuit has a so-called SP7T configuration in which any one of seven signal terminals (transmission terminals Tx1, Tx2, reception terminals Rx2 to Rx4, transmission and reception terminals TRx1, TRx5) is coupled to an antenna terminal ANT, to which an antenna At is coupled.

Which one out of these to couple is selected by the controller 15 based on a control signal from a baseband circuit coupled to the subsequent stage of the high-frequency power amplifier module 1.

A transmission signal of the PCS (Personal Communications Service) system or DCS (Digital Cellular System) system using a 1.71 GHz to 1.91 GHz band is amplified by the power amplifier 11, and is input to the transmission terminal Tx1 serving as a second terminal via the low pass filter 13.

A transmission signal of the GSM system using a 900 MHz band is amplified by the power amplifier 12, and is input to the transmission terminal Tx2 serving as a second terminal via the low pass filter 14. Then, these transmission signals are output via the antenna At by selection from the controller 15.

In addition, in this case, the controller 15 also controls the amplification factor and the like of the power amplifier 11 or power amplifier 12 based on the control signal from the baseband circuit.

Moreover, a received signal input to the reception terminal Rx4 from the antenna At by selection from the controller 15 is output to a demodulation circuit and the like in the subsequent stage, after a signal of a specific frequency (PCS: 1.9 GHz band) is selected by the SAW filter 4 and the received signal is amplified by the low noise amplifier 17.

Similarly, a received signal input to the reception terminal Rx3 is amplified by the low noise amplifier 18 after a specific frequency (DCS: 1.8 GHz band) is selected by the SAW filter 5.

A received signal input to the reception terminal Rx2 is amplified by the low noise amplifier 21 after a specific frequency (GSM: 900 MHz band) is selected by the SAW filter 6. Then, these amplified signals are output to the demodulation circuit and the like.

A transmission signal of the W-CDMA system using 2.1 GHz band is amplified by the power amplifier 7, and thereafter it is passed through the separation of transmission and reception signals by the duplexer 9 and input to the transmission and reception terminal TRx1, and is then output by selection from the controller 15 via the antenna.

On the other hand, a received signal input to the transmission and reception terminal TRx1 from the antenna At is passed through the separation by the duplexer 9 and amplified by the low noise amplifier 19, and is then output to the demodulation circuit and the like. Similarly, a transmission signal of the W-CDMA system using a 900 MHz band is amplified by the power amplifier 8, and thereafter is passed through the separation of transmission and reception signals by the duplexer 10 and input to the transmission and reception terminal TRx5, and is then output by selection from the controller 15 via the antenna At.

Moreover, a received signal input to the transmission and reception terminal TRx5 from the antenna At is passed through the separation by the duplexer 10 and amplified by the low noise amplifier 20, and is then output to the demodulation circuit and the like.

FIG. 2 is a block diagram showing a configuration of the antenna switch 16.

As illustrated therein, the antenna switch 16 includes antenna switches 22 to 29 and booster circuits 30, 31. These antenna switches 22 to 29 switch signals that are transmitted and received based on the control of the controller 15.

The antenna switch 22 is provided between the antenna terminal ANT serving as a first terminal and the transmission terminal Tx1, and the antenna switch 23 is provided between the antenna terminal ANT and the transmission terminal Tx2.

The reception terminals Rx2 to Rx4 are coupled to one connection portion of the antenna switches 24 to 26, respectively, and the other connection portions of these antenna switches 24 to 26 are coupled in common to one connection portion of the antenna switch 27. The antenna terminal ANT is coupled to the other connection portion of the antenna switch 27.

The booster circuit 30 takes in a transmission signal from the transmission terminal Tx1 and generates a boost voltage, and applies the boost voltage to the gate of a switching transistor circuit Q1 (FIG. 3) of the antenna switch 22.

Similarly, the booster circuit 31 takes in a transmission signal from the transmission terminal Tx2 and generates a boost voltage, and applies the boost voltage to a control terminal of a switching transistor of the antenna switch 23.

FIG. 3 is an explanatory view showing a configuration of the antenna switch 22 and a configuration to couple with the booster circuit 30.

The antenna switch 22 includes: transistor circuits Q1, Q2; resistors Rd1 to Rd6; resistors Rdd1 to Rdd4, Rg1 to Rg6, and Rgg1 to Rgg4; and capacitive elements C1 to C5.

The transistor circuit Q1 that functions as a switching transistor circuit includes two-stage connected triple-gate transistors $Q1_1$, $Q1_2$, and the transistor circuit Q2 includes two-stage connected double-gate transistors $Q2_1$, $Q2_2$.

The transistor circuit Q1 is coupled between the transmission terminal Tx1 and the antenna terminal ANT, and the transistor circuit Q2 is coupled between the transmission terminal Tx1 and a ground (reference potential) terminal GND.

The resistors Rd1 to Rd3 are coupled in series between one connection portion of the transistor $Q1_1$ and the other connection portion thereof (between the source/drain), respectively, and the resistors Rd4 to Rd6 are coupled in series between the other connection portion of the transistor $Q1_2$ and one connection portion thereof (between the source/drain), respectively.

Moreover, a bias is supplied from a connection node between the resistor Rd1 and the resistor Rd2 as well as from a connection node between the resistor Rd2 and the resistor Rd3 to two midpoints between the gates in the transistor $Q1_1$, respectively.

Similarly, a bias is supplied from a connection node between the resistor Rd4 and the resistor Rd5 as well as from a connection node between the resistor Rd5 and the resistor Rd6 to two midpoints between the gates in the transistor $Q1_2$, respectively.

One connection portions of the resistive elements Rg1 to Rg3 are coupled to the three gates of the transistor $Q1_1$, respectively, and an output terminal DCgate (FIG. 4) serving as an output part of the booster circuit 30 is coupled to the other connection portions of these resistive elements Rg1 to Rg3, respectively.

Moreover, the capacitive element C3 is coupled between one end (on the antenna terminal ANT side) of the source/drain of $Q1_1$ and the gate nearest thereto.

One connection portions of the resistors Rg4 to Rg6 are coupled to three gates of the transistor $Q1_2$, respectively, and a control terminal Tx1cL is coupled to the other connection portions of these resistors Rg4 to Rg6. The capacitive element C4 is coupled between one end (on the transmission terminal Tx1 side) of the source/drain of the transistor $Q1_2$ and the gate nearest thereto.

A control voltage input from the controller 15 (FIG. 1) to the control terminal Tx1c is applied to the control terminal Tx1cL via a diode Di (wherein the Tx1c side is the anode and the Tx1cL side is the cathode). This diode Di has the function to prevent the reverse current from the gate of the transistor circuit Q1.

Moreover, since a large electric power is input to the transmission terminal Tx1, the booster circuit 30 is coupled between the gate of the transistor circuit Q1 and the transmission terminal. This booster circuit 30 can boost the gate voltage when the transistor circuit Q1 is turned on.

In the transistor circuit Q2, the transmission terminal Tx1 is coupled to one connection portion of the transistor Q2$_1$ via the capacitive element C1, and other connection portion of the transistor Q2$_2$ is coupled to the ground (reference potential) via the capacitive element C3.

Moreover, the other connection portion of the transistor Q2$_1$ and one connection portion of the transistor Q2$_2$ are connected in common. The respective gates of the transistors Q2$_1$, Q2$_2$ are coupled to the ground via the resistors Rgg1, Rgg2 and the resistors Rgg3, Rgg4, respectively.

The capacitive element C2 is coupled between one end (on the transmission terminal Tx1 side) of the source/drain of the transistor Q2$_1$ and the gate near thereto, and the capacitive element C5 is coupled between one end (on the GND side) of the source/drain of the transistor Q2$_2$ and the gate near thereto.

Between the source and the drain of the transistors Q2$_1$, Q2$_2$, the resistors Rdd1, Rdd2 and the resistors Rdd3, Rdd4 are coupled in series, respectively, and a bias is supplied from this connection node to a midpoint between the gates, respectively.

The transistor circuit Q2 is turned off when a 'Hi' level voltage is applied to the control terminal Tx1cL and the transistor circuit Q1 is turned on, and it is turned on when a 'Lo' level voltage is applied to the control terminal Tx1cL and the transistor circuit Q1 is turned off.

FIG. 4 is an explanatory view showing a connection configuration of the booster circuit 30.

The booster circuit 30 includes diodes 32, 33, resistors 34 to 37, and capacitive elements 38, 39, as illustrated therein. Then, the diodes 32, 33, the resistors 34, 35, 37, and the capacitive elements 38, 39 constitute the boost part.

The transmission terminal Tx1 is coupled to one connection portion of the capacitive element 38 serving as a first capacitive element, and one connection portions of the resistors 34 to 36 are coupled to the other connection portion of the capacitive element 38, respectively.

The cathode of the diode 32 serving as a first diode is coupled to the other connection portion of the resistor 34 that is a first resistor, and the anode of the diode 33 serving as a second diode is coupled to the other connection portion of the resistor 35 that is a second resistor. One connection portion of the capacitive element 39 serving as a second capacitive element is coupled to the anode of the diode 32, and the other connection portion of the capacitive element 39 is coupled to the cathode of the diode 33.

Moreover, one connection portion of the resistor 37, which is a third resistor, and the control terminal Tx1cL are coupled to the other connection portion of the capacitive element 39, respectively. The output terminal DCgate, to which a boost voltage is output, is coupled to the other connection portions of the resistors 37, 36 and serves as the output terminal of the booster circuit 30.

In addition, although in FIG. 3 and FIG. 4 the configurations of the antenna switch 22 and the booster circuit 30 are described, the configurations in the antenna switch 23 and the booster circuit 31 are the same as those of FIG. 3 and FIG. 4.

Next, an effect of the booster circuit 30 (31) in this embodiment is described.

Upon application of an on-state voltage to the control terminal Tx1cL, the antenna switch 22 is turned on and an RF signal (transmission signal) passes from the transmission terminal Tx1 through the antenna terminal ANT.

At this time, a part of the transmission signal is supplied to the booster circuit 30 (31). The booster circuit 30 (31) takes in the transmission power, and generates at the output terminal DCgate a boost voltage that is a voltage higher than the control voltage, the control voltage being output from the controller 15 due to the rectification of the diodes 32, 33, and the booster circuit 30 (31) applies the same to the gate of the transistor circuit Q1.

This results in a higher antenna voltage to the gate-source capacitance Cgs of the transistor in the turned-off transistor circuit other than the transistor circuit Q1, thus allowing for providing a deeper turned-off state.

In this case, the configuration, in which the resistor 36 serving as a loss improving resistor is coupled to the output terminal DCgate, sets the passage through resistors of an input transmission power in the RF signal path to only the passage through one resistor 36, so that it is possible to reduce the attenuation of the transmission signal and prevent degradation of the insertion loss characteristic.

FIG. 5 is an explanatory view showing a layout example of the diode 32 (33) of the booster circuit 30 (31).

The diode 32 (33) shown on the right of FIG. 5 has a configuration in which, for example, a drain electrode D and a source electrode S of an MOS (Metal Oxide Semiconductor) transistor T are connected in common, i.e., so-called diode-connected, as shown on the left of FIG. 5.

Then, the common connection portion of the drain electrode D and source electrode S is the cathode of the diode 32 (33), and the gate electrode G of the MOS transistor T is the anode of the diode 32 (33).

Next, the manufacturing process of the resistor 34 (to 37) and the diode 32 (33) used in the booster circuit 30 (31) is described.

FIG. 6 shows a cross sectional view of the resistor 34 (to 37).

First, as shown in FIG. 6, an epitaxial layer EP of GaAs is formed over a semiconductor substrate SUB made of a semi-insulating gallium arsenide (GaAs), and a buffer layer LY1 is formed over the upper surface of the epitaxial layer EP.

Subsequently, an aluminum gallium arsenide (AlGaAs) layer LY2 is formed over the upper surface of the buffer layer LY1, and an n-type gallium arsenide (GaAs) layer LY3 is formed over the upper surface thereof.

Then, after etching the aluminum gallium arsenide layer LY2 and the n-type gallium arsenide layer LY3 on the right side of FIG. 6, an insulating layer IS made of PSG (Phospho Silicate Glass)/SiO, for example, is formed.

Over the insulating layer IS, the resistive element 34 (to 37) made of WSiN, for example, is formed at a position where the aluminum gallium arsenide layer LY2 and the n-type gallium arsenide layer LY3LY3 were etched.

Moreover, FIG. 7 and FIG. 8 are cross sectional views of the MOS transistor T constituting the diode 32 (33).

After forming the resistor 34 (to 37) shown in FIG. 6, the insulating layer IS at positions where source/drain wires SD1, SD2 are to be arranged is etched, as shown in FIG. 7, and these source/drain wires SD1, SD2 are formed with metal wire and the like.

Then, as shown in FIG. 8, in a region surrounded by the source/drain wires SD1, SD2, the insulating layer IS and the n-type gallium arsenide layer LY3 at a position where a gate wire G1 is to be arranged are etched, and then the gate wire G1 is formed with metal wires and the like, thus forming the transistor serving as the diode 32 (33).

Thus, according to this embodiment, it is possible to reduce harmonic distortion in the antenna switch 16 significantly while generating a stable boost voltage by the booster circuits 30, 31.

As described above, although the invention made by the present inventor has been described specifically based on the embodiment, it is obvious that the present invention is not limited to the above embodiment and various modifications may be made without departing from the gist thereof.

For example, in the above embodiment an example of the antenna switch used for a portable phone system and the like that support multiband has been described, but not limited thereto, the invention can be similarly applied, for example, to various kinds of wireless communication systems including an antenna switch used for a wireless LAN and the like that support a plurality of bands (e.g., 2.4 GHz bands, 5 GHz bands).

The present invention is suitable for antenna switches in a semiconductor integrated circuit device as well as a high frequency module, and for a high frequency module directed for mobile telephones including the same, and for an antenna switch used for a wireless LAN, and the like.

What is claimed is:

1. A semiconductor integrated circuit device, comprising:
   a first terminal coupled to an antenna;
   a plurality of second terminals coupled to a transmitting circuit;
   a switching transistor circuit placed between the first terminal and the second terminals respectively and switching a connection between the first terminal and the second terminal; and
   a booster circuit generating and outputting a boost voltage higher than a control signal of the switching transistor circuit, wherein the booster circuit includes:
      a control terminal to which the control signal of the switching transistor circuit is input;
      a boost terminal that outputs a boost voltage; and
      a boost part which takes in a transmission signal output via the switching transistor circuit when the control signal is input to the control terminal, and which generates a boost voltage higher than a voltage level of the input control signal and applies the same to a control terminal of the switching transistor circuit via the boost terminal; and
      a loss improving resistor coupled between the second terminal and the boost terminal and reducing a voltage attenuation of the transmission signal
   wherein the boost part includes:
      a first capacitive element whose one connection portion is coupled to the second terminal;
      a first resistor whose one connection portion is coupled to the other connection portion of the first capacitive element;
      a first diode whose cathode is coupled to the other connection portion of the first resistor;
      a second capacitive element whose one connection portion is coupled to an anode of the first diode;
      a second resistor whose one connection portion is coupled to the other connection portion of the first capacitive element;
      a second diode whose anode is coupled to the other connection portion of the second resistor and whose cathode is coupled to the other connection portion of the second capacitive element; and
      a third resistor whose one connection portion is coupled to the control terminal and the anode of the first diode and whose the other connection portion is coupled to the boost terminal;
   wherein the loss improving resistor is coupled between the other connection portion of the first capacitive element and the boost terminal.

2. The semiconductor integrated circuit device according to claim 1, wherein a transmission signal of a frequency band used in at least one of communication systems of GSM, PCS, and DCS is input to the second terminal coupled to the transmitting circuit.

3. A high-frequency power amplifier module, comprising:
   an antenna connection switching circuit;
   a high-frequency power amplifier receiving a transmission signal from a transmitting circuit and supplying an amplified transmission signal to the antenna connection switching circuit; and
   a controller outputting a control signal to the antenna connection switching circuit to control the antenna connection switching circuit,
   wherein the antenna connection switching circuit includes:
      a first terminal coupled to an antenna;
      a plurality of second terminals coupled to the transmitting circuit;
      a switching transistor circuit placed between the first terminal and the second terminals respectively and switching a connection between the first terminal and the second terminal; and
      a booster circuit generating and outputting a boost voltage higher than the control signal of the switching transistor circuit;
   wherein the booster circuit includes:
      a control terminal to which the control signal of the switching transistor circuit is input;
      a boost terminal outputting a boost voltage;
      a boost part which takes in a transmission signal output via the switching transistor circuit when the control signal is input to the control terminal, and which generates a boost voltage higher than a voltage level of the input control signal and applies the same to a control terminal of the switching transistor circuit via the boost terminal; and
      a loss improving resistor coupled between the second terminal and the boost terminal and reducing a voltage attenuation of the transmission signal
   wherein the boost part includes:
      a first capacitive element whose one connection portion is coupled to the second terminal;
      a first resistor whose one connection portion is coupled to the other connection portion of the first capacitive element;
      a first diode whose cathode is coupled to the other connection portion of the first resistor;
      a second capacitive element whose one connection portion is coupled to an anode of the first diode;
      a second resistor whose one connection portion is coupled to the other connection portion of the first capacitive element;
      a second diode whose anode is coupled to the other connection portion of the second resistor and whose cathode is coupled to the other connection portion of the second capacitive element; and
      a third resistor whose one connection portion is coupled to the control terminal and the anode of the first diode and whose the other connection portion is coupled to the boost terminal;

wherein the loss improving resistor is coupled between the other connection portion of the first capacitive element and the boost terminal.

4. The high-frequency power amplifier module according to claim 3, wherein a transmission signal of a frequency band used in at least one of communication systems of GSM, PCS, and DCS is input to the second terminal coupled to the transmitting circuit.

* * * * *